(12) United States Patent
Wang et al.

(10) Patent No.: US 8,939,275 B2
(45) Date of Patent: Jan. 27, 2015

(54) SUBSTRATE TRANSFER SYSTEM AND SUBSTRATE POSITIONING DEVICE

(71) Applicant: Shenzhen China Star Optoelectronics Technology Co., Ltd., Shenzhen, Guangdong (CN)

(72) Inventors: Yongqiang Wang, Guangdong (CN); Chun hao Wu, Guangdong (CN); Kun hsien Lin, Guangdong (CN); Minghu Qi, Guangdong (CN); Weibing Yang, Guangdong (CN); Zenghong Chen, Guangdong (CN); Zhenhua Guo, Guangdong (CN); Yunshao Jiang, Guangdong (CN); Zhiyou Shu, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 115 days.

(21) Appl. No.: 13/703,350

(22) PCT Filed: Nov. 19, 2012

(86) PCT No.: PCT/CN2012/084815
§ 371 (c)(1),
(2) Date: Dec. 11, 2012

(87) PCT Pub. No.: WO2014/059725
PCT Pub. Date: Apr. 24, 2014

(65) Prior Publication Data
US 2014/0102852 A1    Apr. 17, 2014

(30) Foreign Application Priority Data

Oct. 17, 2012    (CN) .......................... 2012 1 0394209

(51) Int. Cl.
*B65G 13/075*    (2006.01)
*H01L 21/677*    (2006.01)

(52) U.S. Cl.
CPC .......... *B65G 13/075* (2013.01); *H01L 21/6776* (2013.01)
USPC ...................... 198/463.4; 198/465.2; 198/456; 198/394

(58) Field of Classification Search
CPC ............................. B65G 49/06; B65G 13/075
USPC ...................................... 198/463.4
See application file for complete search history.

(56) References Cited

U.S. PATENT DOCUMENTS 3,848,752 A * 11/1974 Branch et al. ............... 414/752.1
3,907,127 A * 9/1975 Bollinger et al. ............ 414/788.9

(Continued)

*Primary Examiner* — Gene Crawford
*Assistant Examiner* — Thomas Randazzo

(57) ABSTRACT

The present invention relates to a substrate transfer system, comprising a number of roller assemblies used for mobile transfer of the glass substrate on it, and a controller used for controlling rotation of the roller assemblies; the substrate transfer system further comprises a substrate positioning device, which is arranged at the end of the transfer direction of the glass substrate by the roller assemblies; the substrate positioning device comprises a positioning pole, which is used for blocking and positioning the glass substrate transferred by the roller assemblies; and a buffer positioning mechanism on which the positioning pole is mounted on, providing mobile buffer for the positioning pole and driving the positioning pole to reset. A buffer reset mechanism is arranged for controlling the position of the positioning pole, and the positioning deviation of the substrate can be further eliminated; it can provide buffer contact for eliminating the risk of fragmentation.

8 Claims, 5 Drawing Sheets

(56) References Cited

U.S. PATENT DOCUMENTS

| | | | |
|---|---|---|---|
| 4,895,244 A * | 1/1990 | Flaugher et al. | 198/394 |
| 4,985,059 A * | 1/1991 | Letemps et al. | 65/62 |
| 5,716,425 A * | 2/1998 | Wolfe et al. | 65/106 |
| 5,927,469 A * | 7/1999 | Dunifon et al. | 198/456 |
| 6,419,075 B1 * | 7/2002 | Ramirez-Martinez et al. | 198/411 |
| 7,712,334 B2 * | 5/2010 | Kanno et al. | 65/29.11 |
| 8,714,342 B2 * | 5/2014 | Halloran et al. | 198/460.1 |
| 2009/0078365 A1 * | 3/2009 | Suehara et al. | 156/249 |

\* cited by examiner a  b

SUBSTRATE TRANSFER SYSTEM AND SUBSTRATE POSITIONING DEVICE

FIELD OF THE INVENTION

The present invention relates to the field of liquid crystal panel manufacture, and more particularly to a substrate transfer system and a substrate positioning device that can be used for liquid crystal panel manufacture.

BACKGROUND OF THE INVENTION

During the liquid crystal panel manufacturing process, the glass substrate 1 is usually transferred by a substrate transfer system. The existing substrate transfer system usually comprises a frame 5, a number of roller assemblies arranged side by side, and a controller 6 for controlling the roller assembly 6.

As shown in FIG. 1, the roller assembly comprises a drive motor 2, a shaft 3 driven by the drive motor 2, and a roller 4 sleeved on the shaft 3. The controller 6 is used to control rotation of the drive motor 2, so as to drive the shaft 3 to rotate, drive the roller 4 to rotate, and then drive the glass substrate 1 placed on the roller 4 to go forward by the friction of the roller 4, thus transferring the substrate.

As shown in FIG. 2, in order to control transfer speed, position, etc. of the glass substrate 1, a deceleration sensor 7, a positioning sensor 8, etc. are further arranged at appropriate positions of the frame 5. When the glass substrate 1 is transferred to the position of the deceleration sensor 7, it is detected by the deceleration sensor 7 which outputs a signal to the controller 6, and the controller 6 controls the drive motor 2 to decelerate, making the glass substrate 1 to decelerate and continue to go forward. An arrowhead as shown in the drawing indicates the transfer direction of the glass substrate 1.

When the glass substrate 1 continues to go to the position of the positioning sensor 8, it is detected by the positioning sensor 8 which outputs a signal to the controller 6, and the controller 6 controls the drive motor 2 to stop, such that the glass substrate 1 stay at a target position.

In order to prevent detection abnormality of the positioning sensor 8 or abnormality of the drive motor 2 which may cause the glass substrate 1 to flow out of the target position to cause a fragmentation, a limit pole 9 is further arranged at the end of the transfer direction of the roller assembly for blocking the glass substrate 1, so as to prevent flowing out of the glass substrate 1.

Further, in order to prevent positioning deviation, the substrate transfer system can also be provided with a moving mechanism for driving the limit pole 9 to move; after the glass substrate 1 is stopped, the limit pole 9 is driven to move by the moving mechanism, and the glass substrate 1 is pushed to move to a predetermined position, thus correcting and confirming the position.

However, the existing substrate transfer system has the following disadvantages at least: 1. because the limit pole 9 is fixedly arranged, the glass substrate 1 is inclined to be fragmented when colliding with the limit pole 9; 2. when the glass substrate 1 goes beyond the predetermined position, the positioning sensor 8 cannot detect it, thus causing the position deviation, proceeding with flowing in this case having a risk of fragmentation; and 3. after the glass substrate 1 is stopped, the limit pole 9 moves over for correcting and confirming the position, during which the glass substrate 1 collides rigidly with the limit pole 9, causing a risk of fragmentation.

SUMMARY OF THE INVENTION

The technical problem to be solved by the present invention is to provide a substrate transfer system that can avoid the positioning deviation and eliminate the risk of fragmentation.

Another technical problem to be solved by the present invention is to provide a substrate positioning device that can avoid the positioning deviation and eliminate the risk of fragmentation.

The present invention adopts the following technical solution to solve its technical problem: a substrate transfer system is provided, comprising a number of roller assemblies used for mobile transfer of a glass substrate on it, and a controller used for controlling rotation of the roller assemblies;

the substrate transfer system further comprises a substrate positioning device, which is arranged at the end of the transfer direction of the glass substrate by the roller assemblies;

the substrate positioning device comprises a positioning pole, which is used for blocking and positioning the glass substrate transferred by the roller assemblies; and a buffer positioning mechanism on which the positioning pole is mounted on, providing mobile buffer for the positioning pole and driving the positioning pole to reset.

In the substrate transfer system of the present invention, the positioning pole is provided at its periphery with a soft package layer.

In the substrate transfer system of the present invention, the substrate transfer system comprises two groups of the substrate positioning devices that are arranged side by side.

In the interactive mobile of the present invention, wherein the camera module and the infrared laser transmitting module are both in the projection direction of the projecting module, and the infrared laser transmitting module is above the camera module.

In the substrate transfer system of the present invention, the buffer positioning mechanism comprises a fixed base;

a sliding plate, slidably arranged on the base; and a reset member, being capable of driving the positioning pole to reset;

the positioning pole is fixedly connected to the sliding plate, and drives the sliding plate to slide translationally relative to the base when the glass substrate pushes the positioning pole.

In the substrate transfer system of the present invention, a ball plate, provided with multiple balls, is arranged between the sliding plate and the base; the sliding plate is mounted on the base translationally slidably via the ball plate.

In the substrate transfer system of the present invention, the base is provided with a through hole;

the end of the positioning pole which fixedly connected to the sliding plate extends toward the base, and inserts into the through hole; and the through hole is provided on its sidewall with a pressure sensor, which is used for detecting magnitude and direction of a force applied to the positioning pole.

In the substrate transfer system of the present invention, the reset member is a tension spring connected between end of the positioning pole and the base.

In the substrate transfer system of the present invention, the pressure sensor is connected to the controller which monitors rotational speed and surface abrasion condition of the roller assemblies according to the magnitude and direction of the force applied to the pressure sensor.

The present invention further provides a substrate positioning device, comprising: a positioning pole, used for blocking and positioning a glass substrate; and a buffer positioning mechanism on which the positioning pole is mounted on, providing mobile buffer for the positioning pole and driving the positioning pole to reset.

In the substrate positioning device of the present invention, the positioning pole is provided at its periphery with a soft package layer;

the buffer positioning mechanism comprises a fixed base;

a sliding plate, arranged on the base slidably; and a reset member, connected between the base and the positioning pole;

the positioning pole is fixedly connected to the sliding plate, and drives the sliding plate to slide translationally relative to the base when the glass substrate pushes the positioning pole; and the reset member can drive the positioning pole to reset;

a ball plate, provided with multiple balls, is arranged between the sliding plate and the base; the sliding plate is mounted on the base translationally slidably via the ball plate;

the base is provided with a through hole;

the end of the positioning pole which fixedly connected to the sliding plate extends toward the base, and inserts into the through hole;

the through hole is provided on its sidewall with a pressure sensor, which is used for detecting magnitude and direction of a force applied to the positioning pole; and the reset member is a tension spring connected between end of the positioning pole and the base.

The present invention has the following beneficial effects: a buffer reset mechanism is arranged for controlling the position of the positioning pole, and the positioning deviation of the substrate can be further eliminate; it can provide buffered contact for the substrate, thus eliminating the risk of fragmentation.

Besides that, the sensor of the buffer reset mechanism can be used for detecting the magnitude, direction, etc. of the force applied to the positioning pole, and monitoring of the rotational speed stability of the drive motor and the surface abrasion condition of the roller of the roller assemblies, and the like for long time.

BRIEF DESCRIPTIONS OF THE DRAWINGS

DETAILED DESCRIPTION OF THE EMBODIMENTS

The present invention will further be explained with reference to drawings and embodiments.

FIGS. 3-10 show an example of the substrate transfer system and the substrate positioning device of the present invention, wherein this substrate transfer system comprises roller assemblies 11, a controller 12, a substrate positioning device, and etc., and can be used in the manufacturing process of the liquid crystal panel. It can be understood that the roller assemblies 11, the controller 12, the substrate positioning device, etc. can be arranged on the same frame, different frames or other equipments.

Various existing roller assemblies 11 can be used in the roller assemblies 11 for supporting the glass substrate 10 to be transferred thereon. And the controller 12, connected to the roller assemblies 11, controls rotational speed, start and stop, etc. of the roller assemblies 11, thus controlling the transfer of the glass substrate 10.

In this example, the roller assemblies 11 comprises a drive motor, shafts driven by the drive motor, rollers sleeved on the shafts, etc. The controller 12 is used to control rotation of the drive motor, drive the shafts to rotate, drive the rollers to rotate, and then drive the glass substrate 10 placed on the rollers to go forward by the friction of the rollers, thus transferring the substrate.

Further, a deceleration sensor 13 can also be arranged at an appropriate position of transfer of the glass substrate 10; when the glass substrate 10 is transferred to the position of the deceleration sensor 13, it is detected by the deceleration sensor 13 which outputs a signal to the controller 12, and the controller 12 controls the drive motor to decelerate, making the glass substrate 10 to decelerate and continue to go forward.

Figure 1:
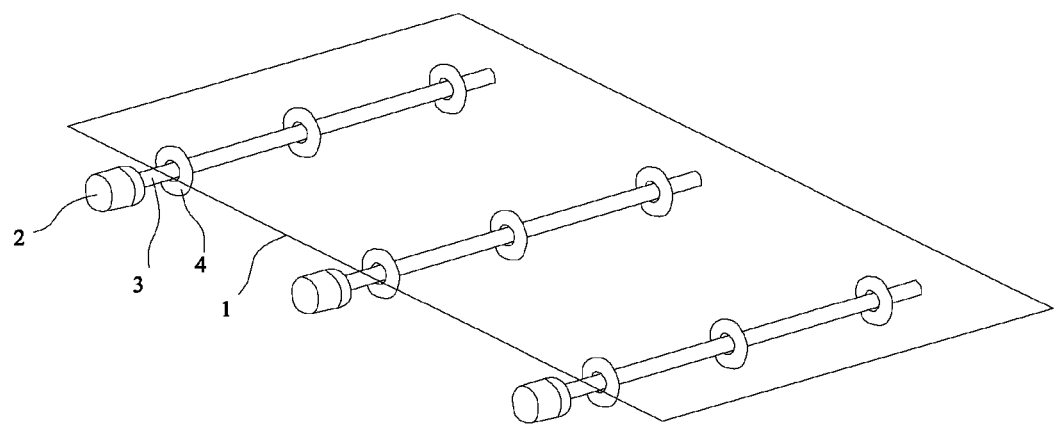
FIG. 1 is a schematic drawing of the roller assemblies of the substrate transfer system in the prior art.
Figure 2:
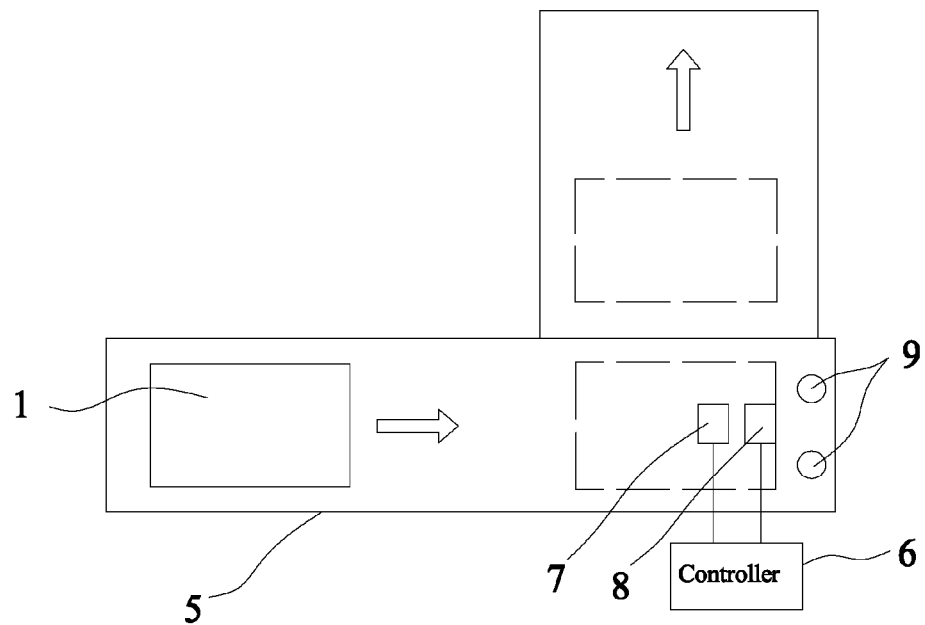
FIG. 2 is a schematic drawing of the substrate transfer system in the prior art.
Figure 3:
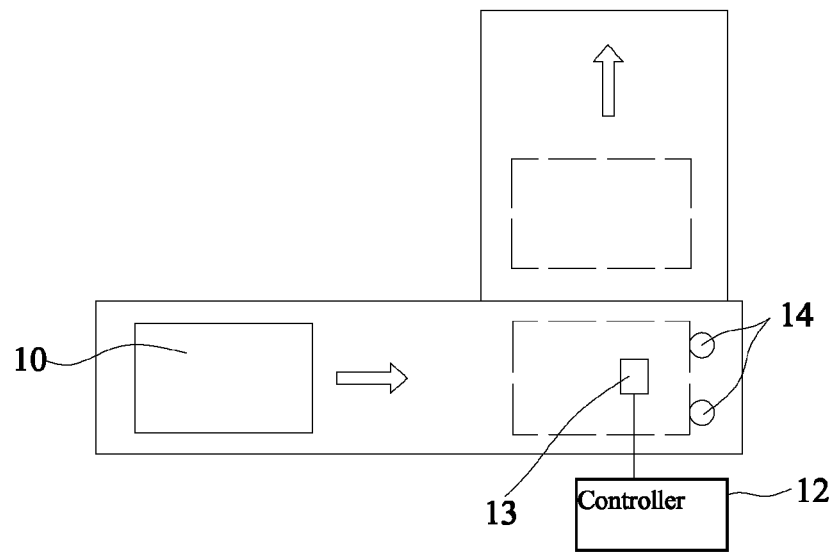
FIG. 3 is a schematic drawing of an example of the substrate transfer system of the present invention.

This substrate positioning device is arranged at the end of the transfer direction of the substrate by the roller assemblies 11 (as shown by the arrowhead in FIG. 3), so as to prevent flowing out of the glass substrate 10. As shown in FIG. 3, the substrate positioning devices are in two groups, which are arranged side by side at the outside of the roller assembly 11; of course, the amount of the substrate positioning device can be set as required, and can include one or more groups; and the position set for the substrate positioning device can also be adjusted according to the desired arrival position of the glass substrate 10.

Figure 4:
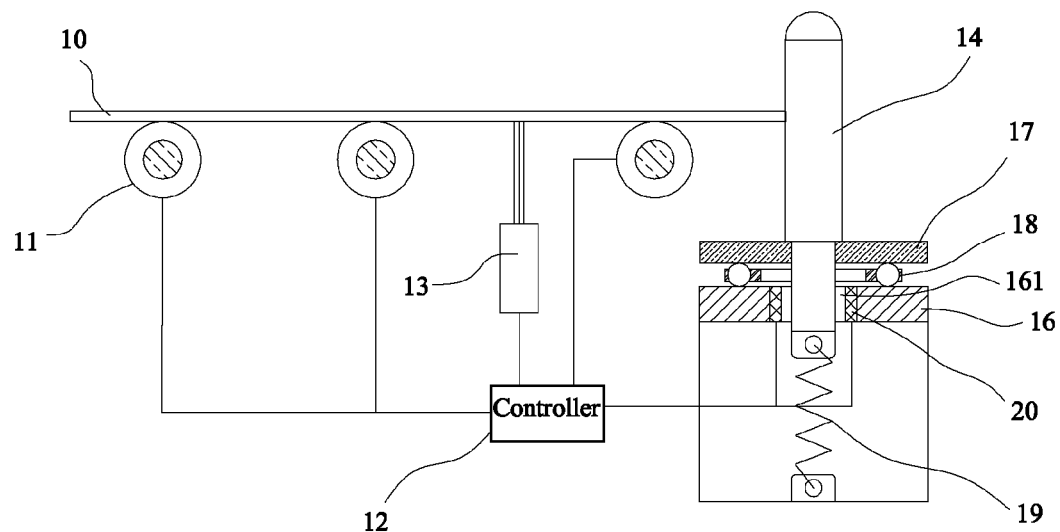
FIG. 4 is a sectional schematic drawing of an example of the substrate transfer system of the present invention.

As shown in FIG. 4, the substrate positioning device comprises a positioning pole 14, a buffer positions mechanism, etc. This positioning pole 14 is used for blocking and positioning the glass substrate 10 transferred by the roller assembly 11, so as to prevent flowing out of the glass substrate 10; while the buffer positioning mechanism is used for the positioning pole 14 mounted thereon, so as to provide mobile buffer for the positioning pole 14 and drive the positioning pole 14 to reset.

Figure 5:
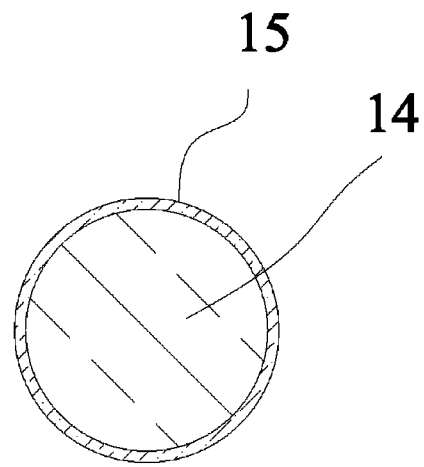
FIG. 5 is a sectional schematic drawing of the positioning pole of an example of the substrate transfer system of the present invention.

As shown in FIG. 5, this positioning pole 14 is provided at its periphery with a soft package layer 15, so as to avoid the risk of fragmentation resulting from rigid contact of the glass substrate 10 with the positioning pole 14. Of course, this positioning pole 14 may not be provided with the soft package layer 15, but be made of elastic materials entirely, which can likewise avoid the rigid contact.

As shown in FIG. 4, this buffer positioning mechanism comprises a base 16, a sliding plate 17, a ball plate 18, a reset member 19, a pressure sensor 20, etc., so as to provide mobile buffer for the positioning pole 14 and drive the positioning pole 14 to reset.

The base 16, as the support of the entire substrate positioning device, can be fixed at the outside of the roller assemblies 11. The base 16 is provided at its upper portion with a through hole 161 to receive the end of the positioning pole 14. The through hole 161 is provided on its sidewall with a pressure sensor 20; when the positioning pole 14 moves under the action of a force, it may depress the pressure sensor 20 which thus detects magnitude, direction, etc. of the force applied to the positioning pole 14. Besides that, the detected signal can be transferred to the controller 12 which analyzes and judges magnitude, direction, etc. of the force, and thus monitors rotational speed, surface abrasion condition, etc. of the roller assembly 11, so as to find the small problems in advance to avoid fragmentation, etc. caused by magnification of the problems.

Figure 6:
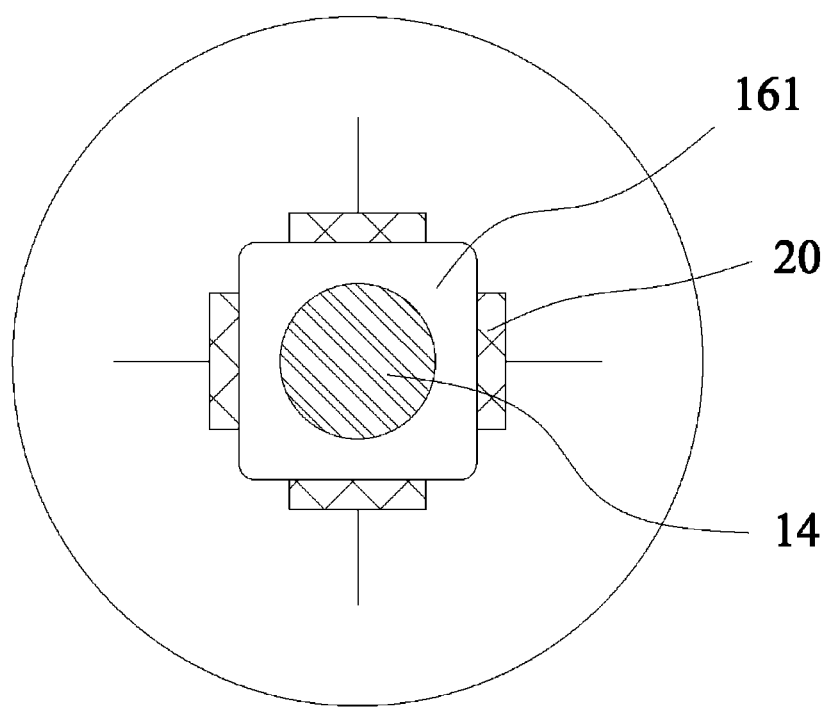
FIG. 6 is a sectional schematic drawing of the pressure sensor layout of an example of the substrate transfer system of the present invention.

In this example, this pressure sensor 20 can be a micro force sensor, and detect very small forces. As shown in FIG. 6, there are four pressure sensors 20, which are evenly distributed at the circumference of the through hole 161. It can be understood that the amount, installation position, etc. of the pressure sensor 20 can be set as required, such as one annular pressure sensor 20, or one, two, three or more pressure sensors 20, so long as magnitude and direction of the force applied to the positioning pole 14 can be detected.

This reset member 19 is used for reset of the positioning pole 14 after its movement by a force, and is a tension spring in this example. The tension spring is fixed at one end to the base 16, and fixedly connected at the other end to the positioning pole 14. When the positioning pole 14 moves under the action of a force, the tension spring is stretched to have a restoring force; after the roller assemblies 11 stop, the tension spring is flexibly restored, which drives the positioning pole 14 to reset, and then the positioning pole 14 pushes the glass substrate 10 to arrive at the set position. It can be understood that this reset member 19 can also be other elastic reset member 19, such as a spring and a connecting rod, so long as it can provide a mechanism for the positioning pole 14 to reset.

This sliding plate 17 is slidably mounted on the base 16, and fixedly connected to the positioning pole 14. When the positioning pole 14 is pushed by the glass substrate 10, it drives the sliding plate 17 to make translational slide on the base 16. It can be understood that the reset member 19 can also act directly on the sliding plate 17 and drives the sliding plate 17 to reset, thus driving the positioning pole 14 to reset.

In order to facilitate the sliding of the sliding plate 17 on the base 16, a ball plate 18, provided with multiple balls, can be arranged between the sliding plate 17 and the base 16; a sliding friction contact is formed between the sliding plate 17 and the base 16 by the balls respectively in contact with the sliding plate 17 and the base 16, thus making the sliding plate 17 mounted on the base 16 translationally slidably. It can be understood that the ball plate 18 can also be of other structural forms, such as arranging the balls on the base 16 or the sliding plate 17 directly; alternatively, arranging a plane bearing between the sliding plate 17 and the base 16 can likewise conveniently drive the sliding plate 17 to make translational slide on the base 16.

As shown in the drawings, the positioning pole 14 matches at its upper portion with the glass substrate 10 for blocking the glass substrate 10; the positioning pole 14 is fixedly connected at its lower portion to the sliding plate 17. The end of the positioning pole 14 which fixedly connected to the sliding plate 17 extends toward the base 16, and inserts into the through hole 161 of the base 16; therefore, when the positioning pole 14 is subject to a force, the force can be transferred to the pressure sensor 20, and the pressure sensor 20 transfers the pressure signal to the controller 12 which controls the roller assemblies 11.

While the glass substrate 10 is transferred by this substrate transfer system, first the glass substrate 10 is placed on the roller assemblies 11 which is controlled by the controller 12 to transfer the glass substrate 10 at a uniform speed.

When the glass substrate 10 is transferred to the position of the deceleration sensor 13, the deceleration sensor 13 detects the signal of arrival of the glass substrate 10, and transfers it to the controller 12. Here the controller 12 controls the roller assembly 11 to decelerate, making the glass substrate 10 to decelerate to go forward.

Figure 7:
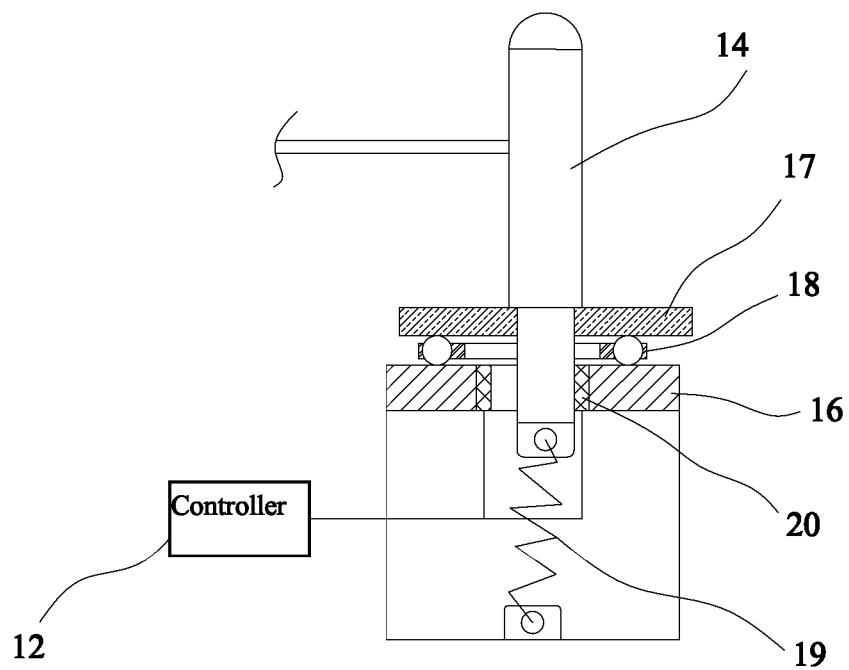
FIG. 7 is a partial sectional schematic drawing of the positioning pole of an example of the substrate transfer system of the present invention when the positioning pole is pushed.

When the glass substrate 10 contacts the positioning pole 14, the positioning pole 14, because of the soft package layer 15 outside, has certain buffer protection function for the glass substrate 10. Because the glass substrate 10 is still be transferred by the roller assemblies 11, a lateral force is produce to push the positioning pole 14. Here the positioning pole 14 drives by a force the sliding plate 17 to make translational slide relative to the base 16, and pulls the tension spring to produce elastic deformation energy storage, as shown in FIG. 7. When the positioning pole 14 comes in contact with the pressure sensor 20, the pressure sensor 20 outputs a signal to the controller 12, which controls the roller assembly 11 to stop, making the glass substrate 10 lose the transfer power. Here the tension spring is flexibly restored, and drives the positioning pole 14 to restore to the initial position. In the process of the positioning pole 14 restored to the initial position, the positioning pole 14 pushes the glass substrate 10 to arrive at the predetermined position, positioning the glass substrate 10 preparably. Here none of the pressure sensors 20 is subject to pressure of the positioning pole 14, and has no outputted values.

Figure 8:
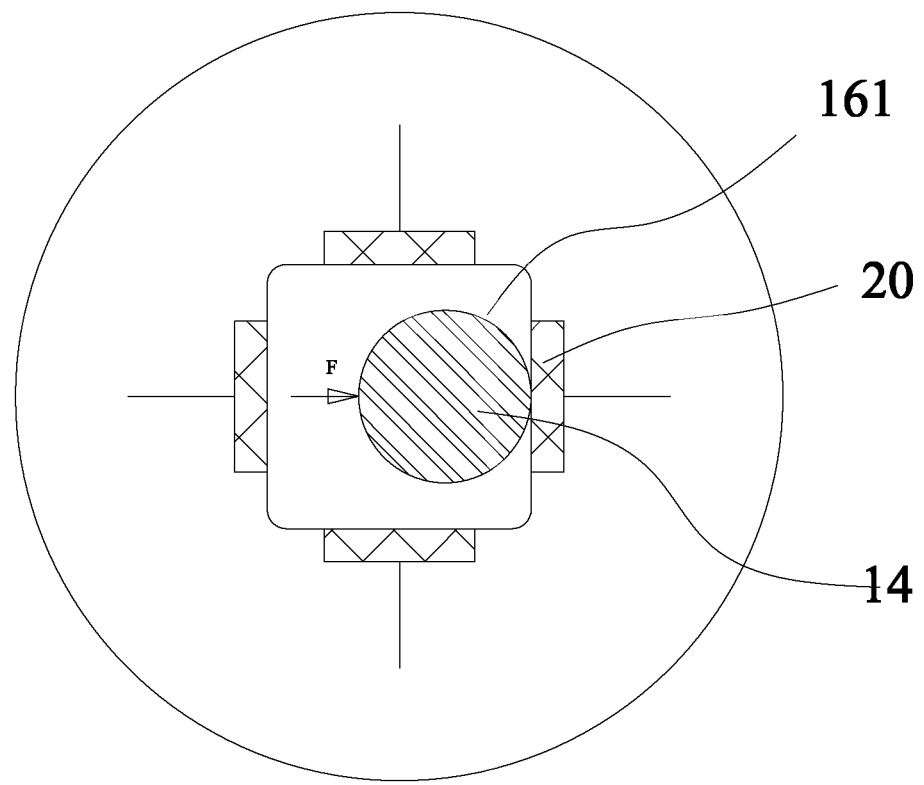
FIG. 8 is a sectional schematic drawing of one pressure sensor of an example of the substrate transfer system of the present invention when a force is applied to the pressure sensor.
Figure 9:
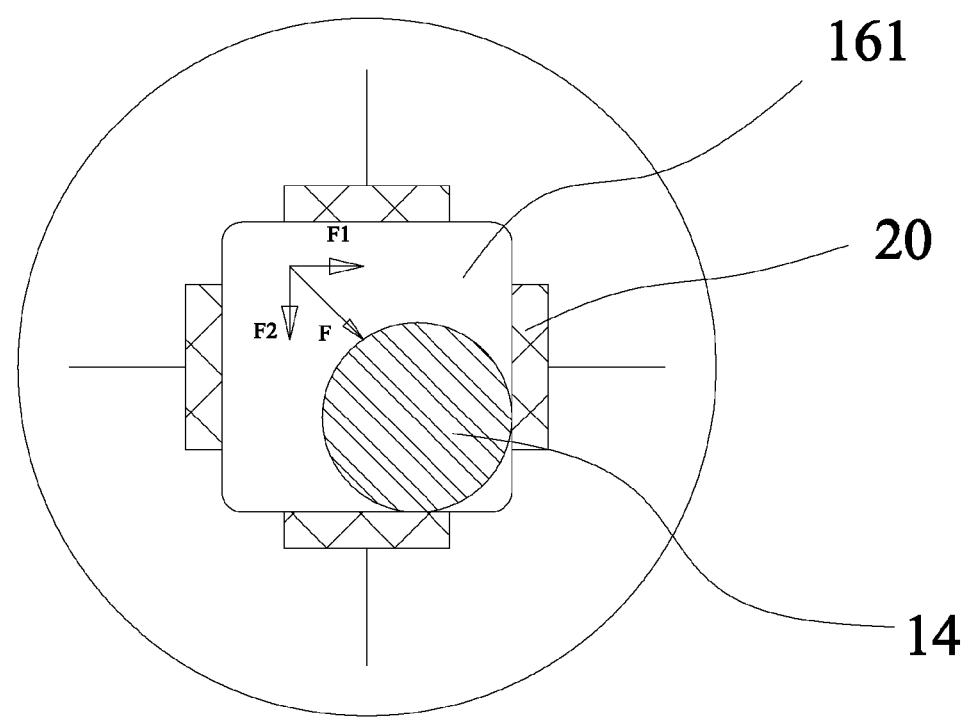
FIG. 9 is a sectional schematic drawing of two pressure sensors of an example of the substrate transfer system of the present invention when a force is applied to the two pressure sensors.
Figure 10:
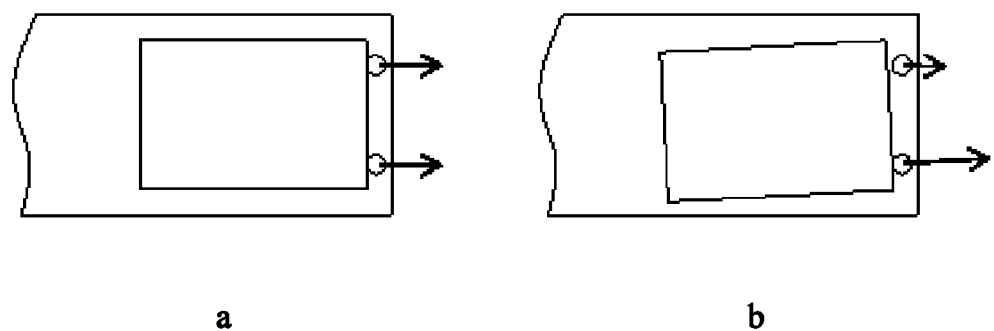
FIG. 10 is a schematic drawing of the glass substrate of an example of the substrate transfer system of the present invention when the glass substrate is in the transfer state.

The single roller assembly 11 has uniform power output, the rollers have the same abrasion, and the positioning pole 14 is subject to a force F only in one lateral direction, as shown in FIG. 8; and when the drive motor of the roller assembly 11 has an unstable rotational speed and inconsistent roller surface abrasion, the transfer of the glass substrate 10 will be deflected, here the positioning pole 14 will act on different pressure sensors 20, and here the pressure sensor 20 can output magnitude (F, F1, F2), direction θ, etc. of the force applied to the positioning pole 14, as shown in FIG. 9.

Long-term monitoring of the rotational speed stability of the drive motor and the surface abrasion condition of the roller of the roller assembly 11 can be realized by combining the two groups of the substrate positioning devices. In the normal situation, as shown in FIG. 10a, the pressure sensor 20 of the two groups of the substrate positioning devices has constant output values, direction, etc.; if the pressure sensor 20 of the two groups of the substrate positioning devices has variation in the output values and direction, it can be judged that the drive motor of the roller assembly 11 has unstable rotational speed and surface abrasion degree of the rollers are uneven, etc., which cause the glass substrate 10 to be transferred deflectedly, as shown in FIG. 10b. Therefore, small problems can be found in advance through observation of variety of magnitude and direction of output value of the pressure sensor 20, so as to avoid fragmentation caused by magnification of the problems.

In this example, the pressure sensor 20 is combined with the positioning pole 14, thus simplifying the structure and eliminating the positioning deviation; besides that, the glass substrate 10 is in buffer contact with the positioning pole 14, thus eliminating the risk of fragmentation; moreover, the positioning pole 14 has the function of detecting magnitude and direction of the contact force in addition to the function of positioning detection, and can be used for long-term monitoring of the rotational speed stability of the drive motor and the surface abrasion condition of the rollers of the roller assemblies 11.

It can be understood that the above examples are only the preferred embodiments of the present invention, and cannot be understood as a limit to the range of the present invention patent in spite of its more specific and detailed description. It should be indicated that those skilled in the art, under the premise of not departing from the concept of the present invention, can combine the above technical features freely, and make some modifications and improvements, which all fall within the scope of protection of the present invention. Therefore, any equivalent transformation and modification within the scope of the claims of the present invention shall fall within the scope of the claims of the present invention.

What is claimed is:

1. A substrate transfer system, comprising a number of roller assemblies used for mobile transfer of a glass substrate on it, and a controller used for controlling rotation of the roller assemblies;
wherein the substrate transfer system further comprises a substrate positioning device, which is arranged at the end of the transfer direction of the glass substrate by the roller assemblies;
the substrate positioning device comprises a positioning pole, which is used for blocking and positioning the glass substrate transferred by the roller assemblies; and
a buffer positioning mechanism on which the positioning pole is mounted on, providing mobile buffer for the positioning pole and driving the positioning pole to reset;
the buffer positioning mechanism comprises: a fixed base; a sliding plate, slidably arranged on the base; and
a reset member, being capable of driving the positioning pole to reset;
the positioning pole is fixedly connected to the sliding plate, and drives the sliding plate to make translational slide relative to the base when the glass substrate pushes the positioning pole;
the base is provided with a through hole;
the end of the positioning pole which fixedly connected to the sliding plate extends toward the base, and inserts into the through hole; and
the through hole is provided on its sidewall with a pressure sensor, which is used for detecting magnitude and direction of a force applied to the positioning pole.

2. The substrate transfer system according to claim 1, wherein that the positioning pole is provided at its periphery with a soft package layer.

3. The substrate transfer system according to claim 1, wherein the substrate transfer system comprises two groups of the substrate positioning devices that are arranged side by side.

4. The substrate transfer system according to claim 1, wherein a ball plate, provided with multiple balls, is arranged between the sliding plate and the base; the sliding plate is mounted on the base translationally slidably via the ball plate.

5. The substrate transfer system according to claim 1, wherein the reset member is a tension spring connected between end of the positioning pole and the base.

6. The substrate transfer system according to claim 1, wherein the pressure sensor is connected to the controller which monitors rotational speed and surface abrasion condition of the roller assemblies according to the magnitude and direction of the force applied to the pressure sensor.

7. A substrate positioning device, wherein it comprises: a positioning pole, used for blocking and positioning a glass substrate; and
a buffer positioning mechanism on which the positioning pole is mounted on, providing mobile buffer for the positioning pole and driving the positioning pole to reset;
the buffer positioning mechanism comprises a fixed base;
a sliding plate, slidably arranged on the base; and
a reset member, connected between the base and the positioning pole;
the positioning pole is fixedly connected to the sliding plate, and drives the sliding plate to slide translationally relative to the base when the glass substrate pushes the positioning pole; and the reset member can drive the positioning pole to reset;
the base is provided with a through hole;
the end of the positioning pole which fixedly connected to the sliding plate extends toward the base, and inserts into the through hole; and
the through hole is provided on its sidewall with a pressure sensor, which is used for detecting magnitude and direction of a force applied to the positioning pole.

8. The substrate positioning device according to claim 7, wherein the positioning pole is provided at its periphery with a soft package layer;
a ball plate, provided with multiple balls, is arranged between the sliding plate and the base; the sliding plate is mounted on the base translationally slidably via the ball plate; and
the reset member is a tension spring connected between end of the positioning pole and the base.

* * * * *